United States Patent [19]

Ozaki et al.

[11] 4,456,939
[45] Jun. 26, 1984

[54] INPUT PROTECTIVE CIRCUIT FOR SEMICONDUCTOR DEVICE

[75] Inventors: Hideyuki Ozaki; Kazuyasu Fujishima, both of Itami, Japan

[73] Assignee: Mitsubishi Denki Kabushiki Kaisha, Tokyo, Japan

[21] Appl. No.: 261,298

[22] Filed: May 7, 1981

[30] Foreign Application Priority Data

Jun. 30, 1980 [JP] Japan ................. 55-90117

[51] Int. Cl.³ .............................................. H02H 3/20
[52] U.S. Cl. .................................... 361/56; 361/91; 361/111; 357/23.13; 307/200 B; 307/304
[58] Field of Search .......................... 361/91, 56, 111; 307/200 A, 200 B, 304; 357/51, 23, 41, 42, 23 D, 23 MG, 23 GP

[56] References Cited

U.S. PATENT DOCUMENTS

| | | | |
|---|---|---|---|
| 3,360,736 | 12/1967 | Nagata | 357/23 MG |
| 3,403,270 | 9/1968 | Pace et al. | 361/91 X |
| 3,445,924 | 5/1969 | Cheroff et al. | 357/23 D |
| 3,470,390 | 9/1969 | Lin | 361/91 X |
| 3,636,385 | 1/1972 | Koepp | 361/91 X |
| 3,777,216 | 12/1973 | Armstrong | 361/91 X |
| 3,917,964 | 11/1975 | Carlson | 357/23 MG |
| 4,204,131 | 5/1980 | Dozier | 307/304 X |
| 4,288,829 | 9/1981 | Tango | 361/91 X |

FOREIGN PATENT DOCUMENTS 54-35756 11/1979 Japan .

OTHER PUBLICATIONS

Patents Abstracts of Japan, vol. 4, No. 112, Aug. 12, 1980, p. 93E21 & Japanese Pat. -A-55 70071, (Mitsubishi Denki K. K.).
Patents Abstracts of Japan, vol. 4, No. 5, Jan. 16, 1980, p. 133E165 & Japanese Pat. -A-54 146975, (Nippon Denki K. K.).

*Primary Examiner*—Patrick R. Salce
*Attorney, Agent, or Firm*—Oblon, Fisher, Spivak, McClelland & Maier

[57] ABSTRACT

An input protective circuit of MIS type device is used by applying reverse bias voltage to a semiconductor substrate and a variable-conductivity element is connected between the input terminal of the MIS type device and the ground so that the input terminal is in conductive state to the ground when the reverse bias voltage is not applied to the semiconductor substrate and the input terminal is in non-conductive state to the ground when the reverse bias voltage is applied to the semiconductor substrate.

2 Claims, 2 Drawing Figures

4,456,939

INPUT PROTECTIVE CIRCUIT FOR SEMICONDUCTOR DEVICE

BACKGROUND OF THE INVENTION

The present invention relates to an input protective circuit for a semiconductor device. More particularly, it relates to an input protective circuit for preventing the breakdown of the insulating layer of a device having MIS type structure such as MIS field-effect transistor, MIS diode, MIS capacitor etc. and an integrated circuit including the device.

In the conventional MIS type device and integrated circuit including the device, surge-noise voltage having a high peak value is sometimes applied from the outside into the input terminal such as the gate when the device is being prepared and handled whereby the gate-insulating layer may be broken down. Recently, integrated circuits are made more compact and designed to operate at a quick speed whereby the thickness of the gate insulating layer of the device is smaller. For example, the surge withstand voltage of silicon dioxide layer having a thickness in the range between 400 Å and 500 Å is almost 40 to 50 volts. Therefore, an input protective circuit assuring the normal operation even in the application of lower surge voltage and the operation characteristic of the device is needed.

FIG. 1 shows an example of the conventional N-channel type input protective circuit.

In the figure, the reference numeral (1) designates a MIS transistor, (2) designates an integrated circuit including the MIS transistor (1), (3) designates an external input terminal, (4) designates a resistor formed, for example, by an N type conductive diffusion region, (5) designates a rectifying diode formed between the N type region and a P type semiconductor substrate, (6) designates an electrostatic capacitance between a node (7) and the ground in an equivalent circuit. The node (7) is also used as an input terminal of the MIS transistor (1) and the integrated circuit (2).

The operation of the protective circuit will be described. When a positive surge voltage is applied to the external input terminal (3), surge current is reduced by the resistor (4) and the node (7) is clamped by the reverse breakdown voltage $V_{BD}$ of the diode (5).

On the other hand, when a negative surge voltage is applied to the external input terminal (3), the node (7) is clamped by the negative voltage (usually −0.6 to −0.7 volt) which is lower than the ground potential for the forward voltage drop in the diode (5).

The conventional input protective circuit having the structure described above has the following disadvantage. The external input terminal (3) is usually in a high input impedance state, that is, the diode is normally in non-conductive state. Therefore, when a positive surge voltage is applied to the external input terminal, the potential of the node (7) increases to the reverse breakdown voltage of the diode (5). The reverse breakdown voltage of the diode (5) is relatively high voltage such as several tens volt in a normally-used impurity concentration of the semiconductor substrate on which an integrated circuit is formed. It is difficult to control the breakdown voltage. It is, therefore, difficult to prevent the breakdown of the insulting layer of the integrated circuit in which the thickness of the gate insulating layer of the internal circuit is in the range between 400 Å and 500 Å.

SUMMARY OF THE INVENTION

It is an object of the present invention to overcome the disadvantage of the conventional protective circuit and to provide an input protective circuit which effectively prevent the breakdown of the gate insulating layer of a MIS type device or an integrated circuit including the MIS type device when they are prepared and handled and which does not impart any adverse affect to the operation characteristic when they are in use.

The foregoing and the other object of the present invention have been attained by providing an input protective circuit for protecting the insulating layer of a MIS type device or an integrated circuit including the MIS type device, in which the input terminal is made conductive to the earth terminal when the device or the circuit is prepared and handled, and the input terminal is made non-conductive to the earth terminal when the device is operated in practical use, said MIS type device or integrated circuit requiring no additional control terminal.

The present invention is suitably applied to the input protective circuit of MIS type device used by applying reverse bias voltage to a semiconductor substrate. In accordance with the present invention a variable-conductivity element is connected between the input terminal of the MIS type device and the ground so that the input terminal is in conductive state to the ground when the reverse bias voltage is not applied to the semiconductor substrate and the input terminal is in non-conductive state to the ground when the reverse bias voltage is applied to the semiconductor substrate.

DESCRIPTION OF THE PREFERRED EMBODIMENT

An embodiment of the present invention will be described with reference to drawing.

Figure 1:
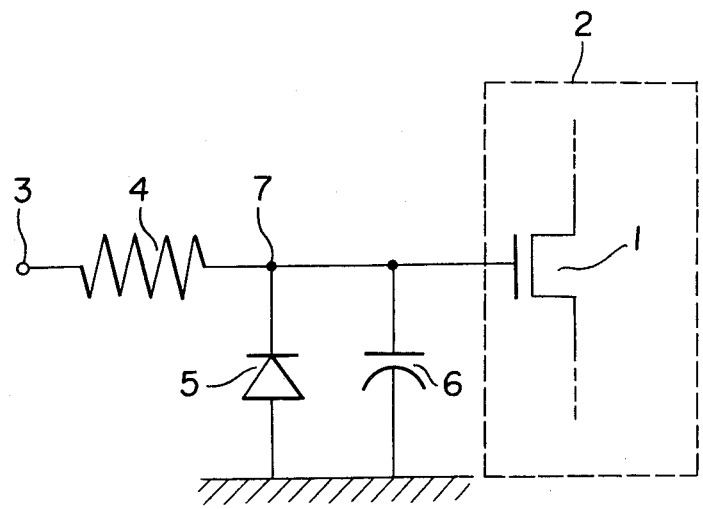
FIG. 1 is a circuit diagram of the conventional input protective circuit.
Figure 2:
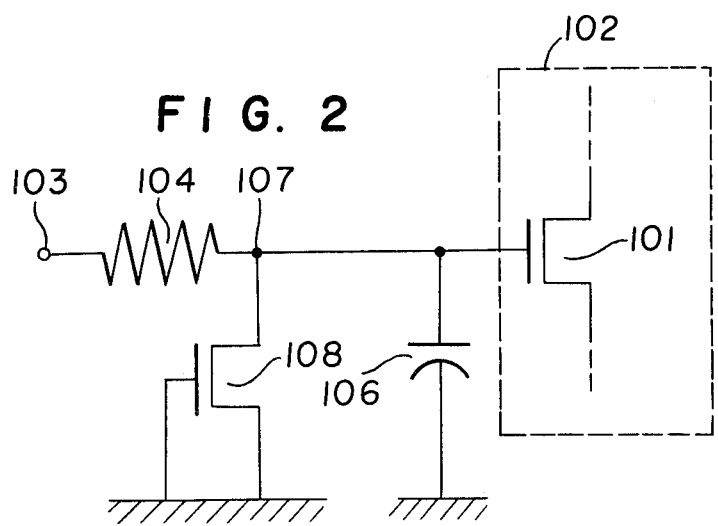
FIG. 2 is a circuit diagram of an embodiment of the input protective circuit of the present invention.

FIG. 2 shows an embodiment of the N-channel type input protective circuit of the present invention.

In the figure, the reference numeral (101) designates a MIS transistor, (102) designates an integrated circuit including the MIS transistor (101), (103) designates an external input terminal, (104) designates a resistor formed, for example, by an N type conductive diffusion region or polysilicon, (106) designates an electrostatic capacitance, such as the gate capacitance of the MIS transistor, which is between a node (107) and the ground in an equivalent circuit and (108) designates a MIS transistor as a variable-conductivity element of the present invention, in which both a source electrode and a gate electrode are connected to the ground and a drain electrode is connected to the node (107) which is used as a common input terminal of the MIS transistor (101) and the integrated circuit (102). The input protective circuit is formed on the same semiconductor substrate as the integrated circuit (102).

In the N-channel type MIS device and the integrated circuit on the P type semiconductor substrate in a monolithic form, a negative bias voltage is normally applied to the semiconductor substrate. The reason for this is as follows. Firstly, in the operation of circuit, an N type region formed on the semiconductor substrate sometimes becomes a negative potential because of undershoot and a electrons are injected into the substrate if the substrate is not biased to keep it in the negative potential thereby adversely affecting the operation of the circuit. Secondly, it is necessary to attain a high speed operation by decreasing the junction capacitance between the P type substrate and the N type region formed on the substrate by applying a reverse bias.

The present invention has been attained following the finding that semiconductor substrates have not been biased when MIS type devices and integrated circuits including the MIS type devices prepared and handled, and bias voltage is often applied to them in use.

The operation of the input protective circuit of the present invention will be described.

The input protective circuit of the present invention uses a MIS type field-effect transistor which operates as a depletion type device when no reverse bias voltage is applied and operates as an enhancement type device when a reverse bias voltage is applied whereby the circuit is operated.

The threshold voltage $V_{TH}$ of the MIS transistor is generally expressed by the following equation 1:

$$V_{TH} = V_{THO} + B_K(\sqrt{|V_{BB}| + 2\phi_F} - \sqrt{2\phi_F}) \quad (1)$$

wherein $V_{THO}$ is the threshold voltage in zero biasing time, $V_{BB}$ is a reverse bias voltage, $\phi_F$ is a Fermi potential of a P type layer and $B_K$ is a body effect constant. $B_K$ can be expressed by equation (2):

$$B_K = \frac{t_{ox}}{\epsilon_{ox}} \sqrt{2q\epsilon_{si}N} \quad (2)$$

wherein $t_{ox}$ is the thickness of a gate-insulating layer, $\epsilon_{ox}$ is the dielectric constant of a gate insulating layer, $\epsilon_{si}$ is the dielectric constant of the silicon substrate and N is the impurity concentration of a substrate.

A MIS transistor which operates as a depletion type device in case of non-application of the reverse bias voltage and operates as an enhancement type device in case of the application of reverse bias voltage, can be designed and prepared by determining $V_{THO}$ in the equation (1) as a certain negative value and then determining the body effect constant $B_K$ which renders the value of $V_{TH}$ positive relative to that of $V_{BB}$ given in use.

On the other hand, the body effect constant $B_K$ can be any desired value depending upon the thickness of the gate insulating layer, the concentration of the semiconductor substrate, or ion-implanting for forming MIS transistor (108) on the semiconductor substrate.

In the practical preparation, N type impurity ions such as arsenic ions having a small diffusion constant may be implanted into a part for forming MIS transistor (108) on the P type semiconductor substrate having a higher impurity concentration whereby a MIS transistor having a surface part operating as a depletion type transistor and having a depletion layer which can expand to a location of a higher impurity concentration level in the P type layer of the substrate in the application of the reverse bias voltage thereby increasing the body effect constant.

The operation of the input protective circuit employing the MIS transistor (108) is as follows.

When an integrated circuit is prepared and handled, the MIS transistor (108) remains a depletion type device because reverse bias voltage is not applied and remains in conductive state because its gate electrode is earthed. As a result, the gate electrode of the MIS transistor (101) in the integrated circuit is also connected through the MIS transistor (108) to the ground in low impedance.

In such a state, even though a surge voltage is applied to the external input terminal (103), the electric charge can be by-passed through the current path of the resistor (104) and the MIS transistor (108) so that voltage is not substantially applied to the gate electrode of the MIS transistor (101).

On the other hand, since negative voltage is applied in use, to the semiconductor substrate on which an integrated circuit is formed, the MIS transistor (108) is made an enhancement type device and is in non-conductive state because the gate electrode is earthed. Any input signal fed to the external input terminal, therefore, does not leak to the earth terminal.

In this embodiment, the description has been made of a N-channel type MIS field-effect transistor. It is clear that P-channel type device is also applicable. It is also clear that the reverse bias voltage can be applied from either the outside or a reverse bias voltage producing circuit on the semiconductor substrate. Any variable conductivity element can be used instead of the MIS transistor (108).

In accordance with the present invention, a variable-conductivity element is provided, which renders the input terminal of a MIS type device a low impedance to the ground when no reverse bias voltage is applied to a semiconductor substrate and renders the input terminal a high impedance when applied, whereby a remarkably effective input protective circuit is provided for the MIS device having a thin gate insulating layer and an integrated circuit including the MIS devices.

The input protective circuit has advantages of assuring protection for the semiconductor devices in use without adverse affect and of eliminating the need for a special control terminal.

We claim:

1. An input protective circuit for a MIS type semiconductor device which is operated by applying reverse bias voltage to the substrate of said semiconductor, comprising:
   a MIS field-effect transistor means connected between ground and the input terminal of said MIS type device wherein said field-effect transistor means has its drain electrode connected to said input terminal of said MIS type device and the source electrode and gate electrode of said field-effect transistor means is grounded and wherein said field-effect transistor means acts as a depletion layer device which is conductive when a reverse bias is not applied to said substrate and wherein said field-effect transistor means acts as a enhancement device which is nonconductive when said reverse bias is applied to said substrate.

2. An input protective circuit according to claim 1 wherein said input terminal is connected to an external terminal through a resistor formed on the semiconductor substrate by a polysilicon or the impurity diffusion region having a conductive type opposite that of the semiconductor substrate.

* * * * *